United States Patent
Hariharan

(10) Patent No.: US 9,252,465 B2
(45) Date of Patent: Feb. 2, 2016

(54) BATTERY RECHARGE ESTIMATOR USING BATTERY IMPEDANCE RESPONSE

(75) Inventor: Krishnan S Hariharan, Bangalore (IN)

(73) Assignee: GM Global Technology Operations LLC, Detroit, MI (US)

( * ) Notice: Subject to any disclaimer, the term of this patent is extended or adjusted under 35 U.S.C. 154(b) by 166 days.

(21) Appl. No.: 13/114,336

(22) Filed: May 24, 2011

(65) Prior Publication Data

US 2012/0303208 A1    Nov. 29, 2012

(51) Int. Cl.
   G01R 31/36   (2006.01)
   H01M 10/48   (2006.01)
   H01M 10/0525 (2010.01)

(52) U.S. Cl.
   CPC ........... *H01M 10/48* (2013.01); *G01R 31/3662* (2013.01); *H01M 10/0525* (2013.01); *Y02T 10/7011* (2013.01)

(58) Field of Classification Search
   CPC .............. H01M 10/48; H01M 10/0525; Y02T 10/7011; G01R 31/3662
   USPC ......................................................... 702/63
   See application file for complete search history.

(56) References Cited

U.S. PATENT DOCUMENTS

| | | | |
|---|---|---|---|
| 6,208,147 B1 * | 3/2001 | Yoon et al. ..................... | 324/430 |
| 2002/0084771 A1 * | 7/2002 | Lundberg ....................... | 320/134 |
| 2006/0033475 A1 * | 2/2006 | Moore .......................... | 320/132 |
| 2007/0090843 A1 * | 4/2007 | De Doncker et al. ......... | 324/426 |
| 2007/0152637 A1 * | 7/2007 | Cherng et al. ................ | 320/134 |
| 2009/0058367 A1 * | 3/2009 | Naik ............................. | 320/136 |
| 2009/0099802 A1 * | 4/2009 | Barsoukov et al. ............ | 702/65 |
| 2009/0171598 A1 * | 7/2009 | Nakashima et al. ........... | 702/63 |
| 2010/0076705 A1 * | 3/2010 | Liu et al. ........................ | 702/63 |
| 2011/0031048 A1 * | 2/2011 | Ohkura ........................ | 180/65.1 |

FOREIGN PATENT DOCUMENTS

| CN | 1791804 A | 6/2006 |
|---|---|---|
| CN | 101322280 A | 12/2008 |

OTHER PUBLICATIONS

Chinese Office Action dated Oct. 31, 2014 ; Application No. 201210163497.X ; Applicant: GM Global Technology Operations LLC; 8 pages.

* cited by examiner

*Primary Examiner* — John Breene
*Assistant Examiner* — Stephanie Bloss
(74) *Attorney, Agent, or Firm* — BrooksGroup

(57) ABSTRACT

An exemplary embodiment includes a method for determining a time to recharge a rechargeable battery system including providing impedance data over a frequency range, said impedance data characterizing the operation of a rechargeable battery within a selected time window; analyzing said impedance data for predetermined behavior of said impedance data indicating an approaching state of discharge of said battery; and, determining from said predetermined behavior of said impedance data whether a recharge of said rechargeable battery is indicated.

20 Claims, 4 Drawing Sheets

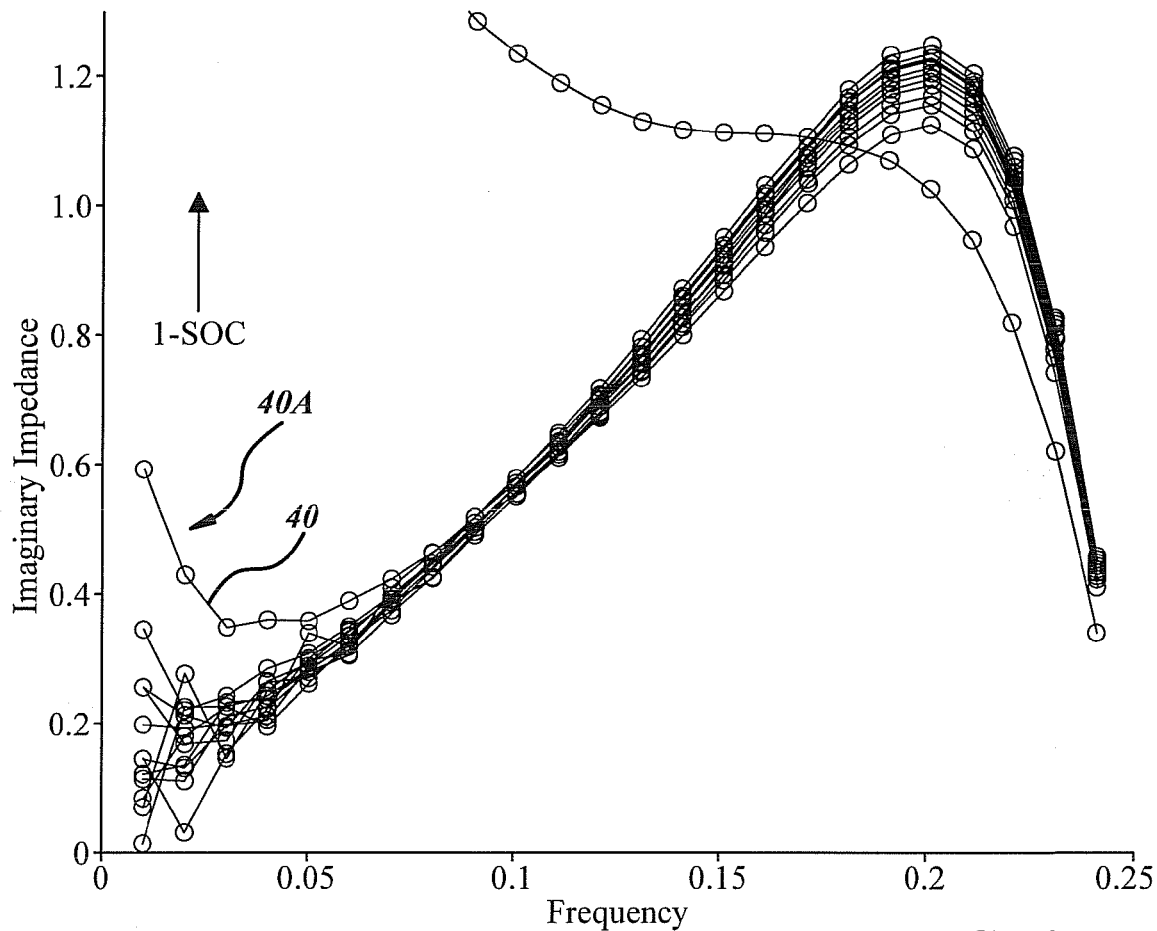
FIG. 4B
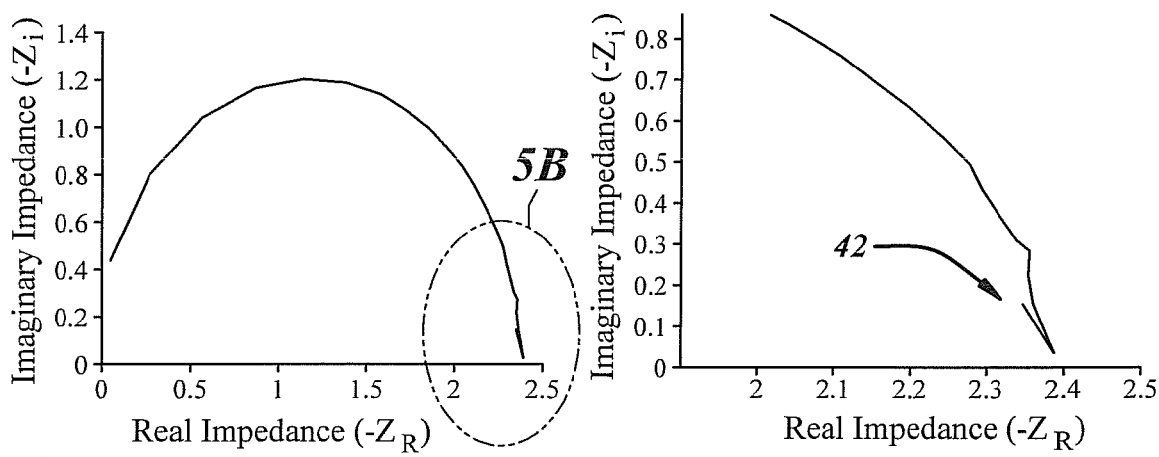
FIG. 5A
FIG. 5B

BATTERY RECHARGE ESTIMATOR USING BATTERY IMPEDANCE RESPONSE

TECHNICAL FIELD

The field to which the disclosure relates includes methods for determining a state of charge (SOC) and/or determining if and when a battery system should be recharged including a lithium ion battery system.

BACKGROUND

Lithium ion batteries are a type of rechargeable battery in which a lithium ion moves between a negative electrode and a positive electrode. Lithium ion batteries are commonly used in consumer electronics. In addition to uses for consumer electronics, lithium ion batteries are growing in popularity for defense, automotive, and aerospace applications due to their high energy density.

SUMMARY OF EXEMPLARY EMBODIMENTS OF THE INVENTION

One exemplary embodiment includes a method for determining a time to recharge a rechargeable battery system including providing impedance data over a frequency range, said impedance data characterizing the operation of a rechargeable battery within a selected time window; analyzing said impedance data for predetermined behavior of said impedance data indicating an approaching state of discharge of said battery; and, determining from said predetermined behavior of said impedance data whether a recharge of said rechargeable battery is indicated.

Another exemplary embodiment includes a method for determining whether a recharge of a rechargeable battery system is indicated including providing impedance data over a frequency range, said impedance data characterizing the operation of a rechargeable battery within a selected time window; analyzing said impedance data for predetermined behavior of said impedance data indicating an approaching state of discharge of said battery; and, determining from said predetermined behavior of said impedance data whether a recharge of said rechargeable battery is indicated including determining an estimated time within which said recharge should take place.

Another exemplary embodiment includes a vehicle system for determining whether a recharge of a rechargeable battery system is indicated including an on-board controller in communication with a vehicle battery system, said controller programmed to determine impedance data over a frequency range, said impedance data characterizing the operation of a rechargeable battery within a selected time window; said controller further programmed to analyze said impedance data for predetermined behavior of said impedance data indicating an approaching state of discharge of said battery system; said controller further programmed to determine from said predetermined behavior of said impedance data whether a recharge of said rechargeable battery is indicated; wherein said controller is further programmed to output at least one of a signal and a numerical value in response to a determination that said recharge is indicated.

Other exemplary embodiments will become apparent from the detailed description provided hereinafter. It should be understood that the detailed description and specific examples, while disclosing exemplary embodiments, are intended for purposes of illustration only and are not intended to limit the scope of the invention.

BRIEF DESCRIPTION OF THE DRAWINGS

Exemplary embodiments of the invention will become more fully understood from the detailed description and the accompanying drawings, wherein:

FIG. 5 is a graph showing an exemplary plot of imaginary impedance versus real impedance including an exemplary low frequency portion.

DETAILED DESCRIPTION OF EXEMPLARY EMBODIMENTS

The following description of the embodiment(s) is merely exemplary (illustrative) in nature and is in no way intended to limit the invention, its application, or uses.

In one embodiment, an impedance value at several frequencies is determined for a battery cell in order to determine whether a battery recharge for a battery system is indicated (is desirable and/or required). In some embodiments, the method may be implemented in software and/or hardware referred to herein as a recharge estimator and may further estimate a time when a battery recharge for a battery system will be desirable and/or required (time to recharge). In other embodiments, the estimator may be implemented separately from or integrated with a state of charge (SOC) estimator which may also be implemented in software and/or hardware to estimate a state of charge (SOC) of the battery system.

In one embodiment, the SOC of a battery cell and/or battery system may be determined by a method including determining (measuring) current and/or voltage discharge data in one or more battery cells of a battery system, and determining impedance data as a function of frequency (impedance spectrum) from the current and voltage discharge data. In some embodiments, the impedance as a function of frequency (impedance spectrum) may be determined by performing a Fourier transform on the current and/or voltage discharge data. In other embodiments, the current and/or voltage discharge data may be collected within a relatively narrow window around a particular or selected state of charge (SOC) of the battery system.

In some embodiments, the current and/or voltage discharge data may be determined from one or more battery cells including a lithium containing electrode. In one embodiment, the current and/or voltage discharge data may be determined from one or more battery cells including a lithium containing iron phosphate cathode (on discharge) (e.g., $Li_xFePO_4$ where $0<x<1$ between a charged and discharged state). It will be appreciated that in some embodiments, a battery cell may further include a graphite anode (e.g., $Li_yC_6$ where $0<Y<1$ between a charged and discharged state). It should also be noted that due to the multi-phase coexistence, the discharge voltage of a battery cell with the above mentioned $Li_xFePO_4$ cathode is predominantly constant, before a sharp fall at the end-of-discharge.

Figure 1A:
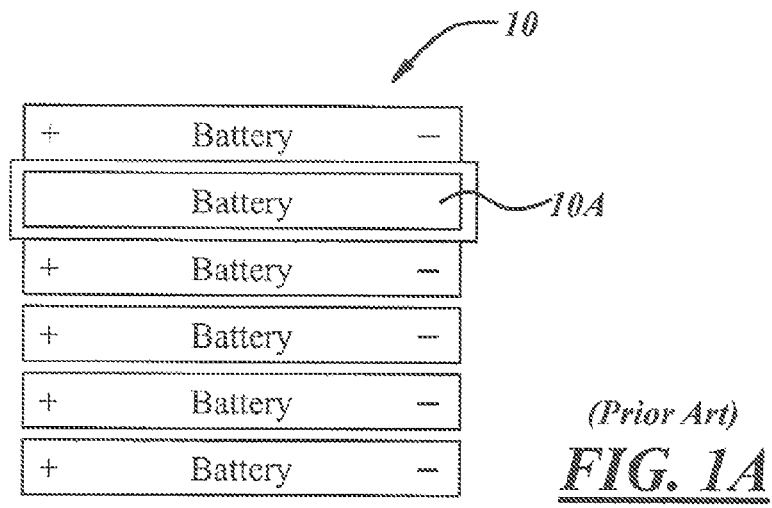
FIG. 1A is a schematic view of an exemplary battery system including multiple lithium ion battery cells according to the prior art.

In some embodiments, the battery system may include one or more lithium ion battery cells. In one embodiment, the battery system may include a plurality of lithium ion battery cells connected in series. In other embodiments, the battery cell may be a portion of a vehicle battery system such as providing power in an electric or hybrid vehicle. For example, referring to FIG. 1A is shown a schematic of a typical exemplary battery system 10 including a plurality of battery cells e.g., 10A, e.g., connected in series to produce a desired output voltage.

Figure 1B:
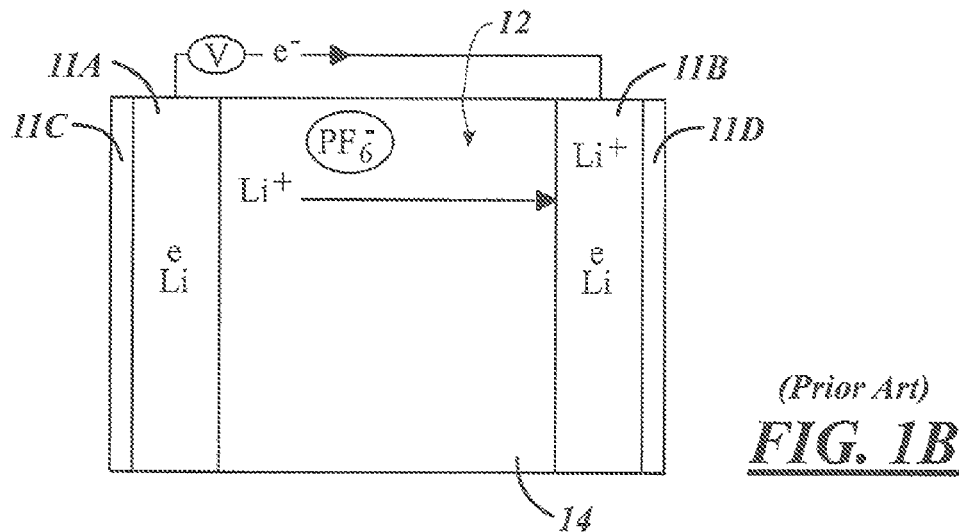
FIG. 1B is a schematic view of an exemplary lithium ion battery cell according to the prior art.

For example, referring to FIG. 1B is shown a schematic of a typical exemplary thin film lithium ion battery cell having a solid state positive electrode (the cathode on discharge) 11A which may be adjacent a separator 14 which may be a porous woven polymer (e.g., propylene and ethylene) containing a liquid electrolyte (e.g., hydrocarbon solution of lithium salt e.g., $LiPF_6$) and which may also be adjacent a solid state negative electrode (the anode on discharge) 11B. The electrodes may include a metal current collector e.g., 11C, 11D onto which host electrode materials (e.g., metal oxide anode and graphite cathode) are respectively attached. For example, the host electrode materials may be porous material thin films formed of particles held together by a conductive binder. The separator 14 may have a thickness on the order of or less than the electrode thickness (e.g., 10-100 microns).

In some embodiments the temperature of one or more of the battery cells in the battery system may be determined together with current and/or voltage discharge data of the same or different battery cell. In some embodiments, the current and/or voltage discharge data to determine an impedance spectrum may be determined at about a constant state of charge (SOC), for example, current and/or voltage discharge data near a selected SOC (or 1-SOC), e.g., within about 0.01 to about 0.1 of a selected SOC where the SOC is normalized to 1. In one embodiment, the current and/or voltage discharge data together with the temperature may then be used as an input to a software and/or hardware implemented recharge indicator/estimator which may first determine an impedance spectrum and may then analyze the impedance spectrum to determine whether battery recharge is indicated and/or to estimate a time to a desirable and/or required battery recharge.

In other embodiments, the impedance spectrum of an electrode, e.g., cathode (on discharge) may be measured directly, e.g., by an impedance analyzer that determines the real and imaginary parts of impedance versus frequency following voltage and/or current measurements of a battery cell.

In one embodiment an algorithm to determine and then analyze an impedance spectrum from current and/or voltage discharge data may be implemented in preprogrammed instructions (software) and/or hardware and executed by a controller (e.g., including a microprocessor and memory). In other embodiments, the current and/or voltage discharge data and/or the impedance spectrum may also be used as input to a state of charge (SOC) estimator to determine a state of charge (SOC) of the battery system. In some embodiments, a temperature of the battery cell at which the current and/or voltage discharge data is taken may additionally be determined in order to determine a variation in the current and/or voltage discharge data due to temperature changes as distinguished from a variation attributable to the SOC of the battery system.

In some embodiments, the measured current and/or voltage discharge data and/or the impedance spectrum may be used in conjunction with an SOC estimator. In some embodiments, an SOC estimator may use as additional or alternative inputs (with respect to the recharge estimator) of one or more of voltage measurements including open circuit voltage, current measurements, and temperature measurements of one or more battery cells. It will be appreciated that determination of an SOC value by the SOC estimator may include determining related properties such as a state of power and/or a state of health of a battery system, as is known in the art.

Figure 2:
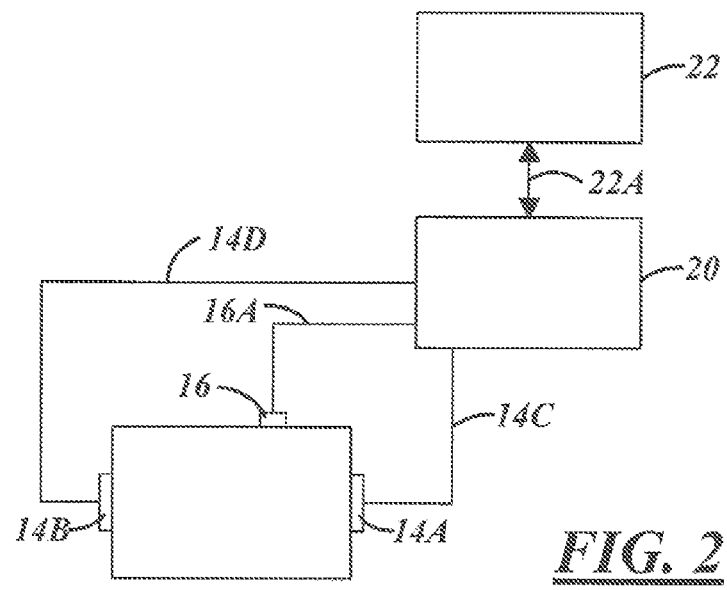
FIG. 2 is a schematic view of an exemplary vehicle system including a battery cell in communication with on board vehicle controllers programmed to collect voltage and/or current discharge data from the battery cell and determine whether a battery recharge is indicated according to an embodiment.

Referring to FIG. 2, in one embodiment, an exemplary battery cell 10A is shown which may be in signal communication (wired or wireless) (e.g., 14C, 14D) with one or more controllers e.g., on board controller 20. Battery cell current and/or voltage discharge data which may be collected from a respective anode and cathode battery leads (e.g., 14A, 14B) and communicated to a controller e.g., 20. In some embodiments, battery cell temperature data may also be collected from a temperature sensor (e.g., 16) which may located internally or externally to the battery cell 10A and which may be in communication (wired or wireless) (e.g., 16A) with the on board controller 20.

Still referring to FIG. 2, in some embodiments, the controller 20 may be equipped with a processor which may be capable of executing preprogrammed instructions (software) from memory as well as storing and/or outputting results. In some embodiments, the controller 20 may include conventional executable software programmed to determine a state of charge (SOC) of the battery from signal inputs. In some embodiments, controller 20 may execute the same or separate software (e.g., a battery recharge estimator) programmed to derive and analyze an impedance spectrum and to determine whether a battery recharge is indicated and/or a recommended battery recharge time.

In some embodiments, following determination of an indicated battery recharge and/or recommended battery recharge time, a signal and/or value indicating the same may then be output by the controller 20. In some embodiments, the signal and/or value indicating recharge may be output to a second onboard controller e.g., 22 which may be central vehicle onboard controller in communication (wired or wireless e.g., 22A) with the controller 20 and which may in turn output a visual and/or audio signal indicator accessible by a vehicle user (e.g., within vehicle).

Figure 3A:
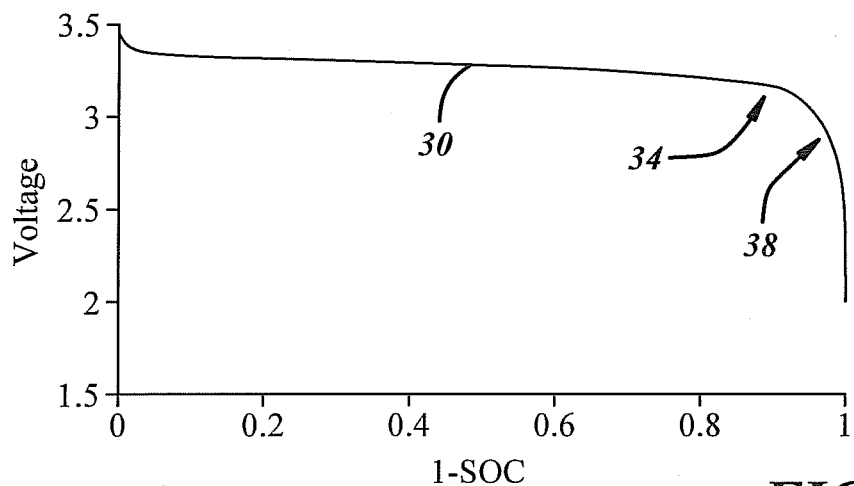
FIG. 3A is the graph showing an exemplary plot of the discharge voltage output from a battery cell and 3B is the graph showing an exemplary plot of imaginary impedance versus real impedance at a selected level of SOC prior to an exemplary voltage drop off versus state of charge (SOC) (1-SOC) of an exemplary battery system.
Figure 3B:
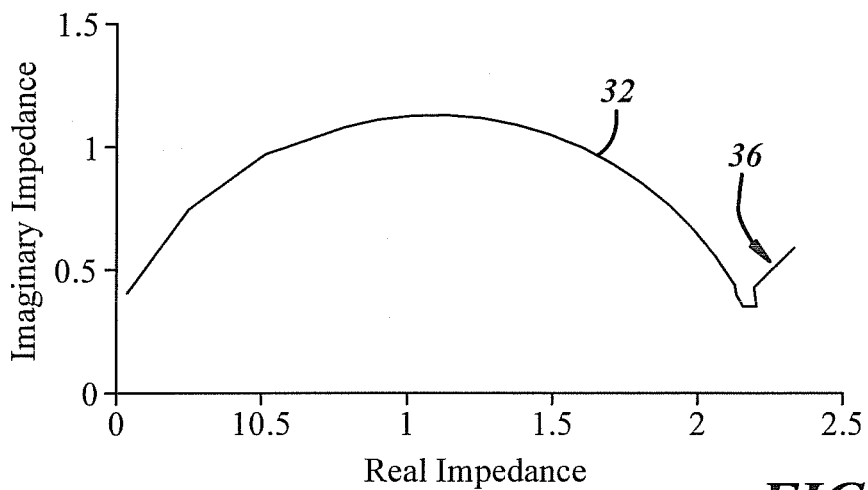

For example, referring to FIG. 3A is shown a voltage response curve e.g., 30 versus state of charge (SOC) (shown as 1-SOC e.g., where 1 is fully discharged) for a battery system. It should be noted that the discharge voltage as shown in FIG. 3A is predominantly at a constant value, before a sharp fall at the end-of-discharge. Referring to FIG. 3B is shown a plot e.g., 32 of the imaginary part of the impedance spectrum versus the real part of the impedance spectrum (e.g., imaginary vs. real at a selected frequency). The Imaginary vs.

Real impedance plot is derived from data collected at a selected SOC (or 1-SOC) (indicated by arrow 34 shown in FIG. 3A). In some embodiments, the low frequency end of the imaginary vs. real impedance spectrum (e.g., high impedance) may be analyzed to determine whether the battery system is at or near a charge state where the battery system should be or is required to be discharged.

Still referring to FIGS. 3A and 3B, it has been found that the low frequency end of the imaginary vs. real impedance spectrum has a tail e.g., 36 that may be a precursor indicator that the SOC (or 1-SOC) of the battery system may be approaching an area (e.g., 38) of relatively steep voltage drop-off. In some embodiments, the precursor indicator, e.g., low frequency tail indicating an approaching SOC voltage response drop-off may be used as an indicator that battery recharge is required and/or desirable and/or to estimate a time to a required and/or desired battery recharge.

Figure 4A:
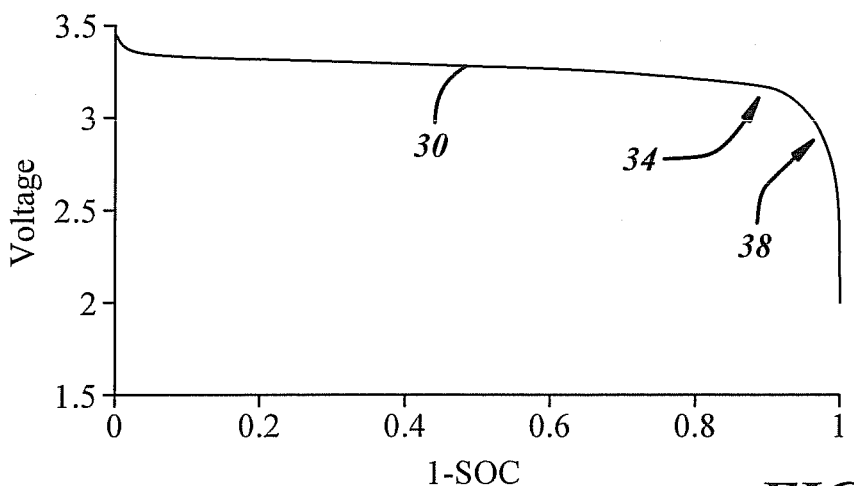
FIG. 4A is the graph showing an exemplary plot of the discharge voltage output from a battery cell and 4B is the graph showing an exemplary plot of imaginary impedance versus frequencies at a level of SOC prior to an exemplary voltage drop off versus state of charge (SOC) (1-SOC) of an exemplary battery system.

Referring to FIG. 4A is shown a similar voltage response curve e.g., 30 versus 1-SOC where impedance data is analyzed around a particular 1-SOC value e.g., 34 shown in FIG. 4B. Referring to FIG. 4B are shown plots (e.g., 40) of imaginary impedance versus a frequency value (e.g., arbitrary units where the frequency may represented as a fraction of the frequency range). In some embodiments, a negative slope as frequencies approach zero (e.g., area 40A) may be used as one indicator of SOC (or 1-SOC) of the battery system approaching an area of relatively steep voltage drop-off e.g., 38, where the battery may be recharged prior to reaching area 38 or at least prior to full discharge indicated at 1.

Referring to FIG. 5 is shown an exemplary plot A of imaginary (−Zi) versus real (−Zr) impedance plot where the dotted circled area around the low frequency tail portion of the plot is shown expanded in plot B. In some embodiments, the low frequency tail portion may include an inward portion e.g., 42 that may be used as an indicator that recharge of the battery system is not desired and/nor required and/or to estimate a time to battery recharge. In some embodiments the low frequency tail portion may include an innermost portion that may have a distance from the center of the semicircle of the full impedance plot (e.g., plot A) that may be less that a radius of the semicircle.

In other embodiments, both of the indicators discussed above, e.g., negative slope on approaching zero frequency as in FIG. 4B and a low frequency tail having an innermost portion outward of the semicircle plot radius as in FIG. 3B may be used as indicators that recharge of the battery system is desired and/or required and/or estimate a time to such desired and/or required recharge.

Figure 6:
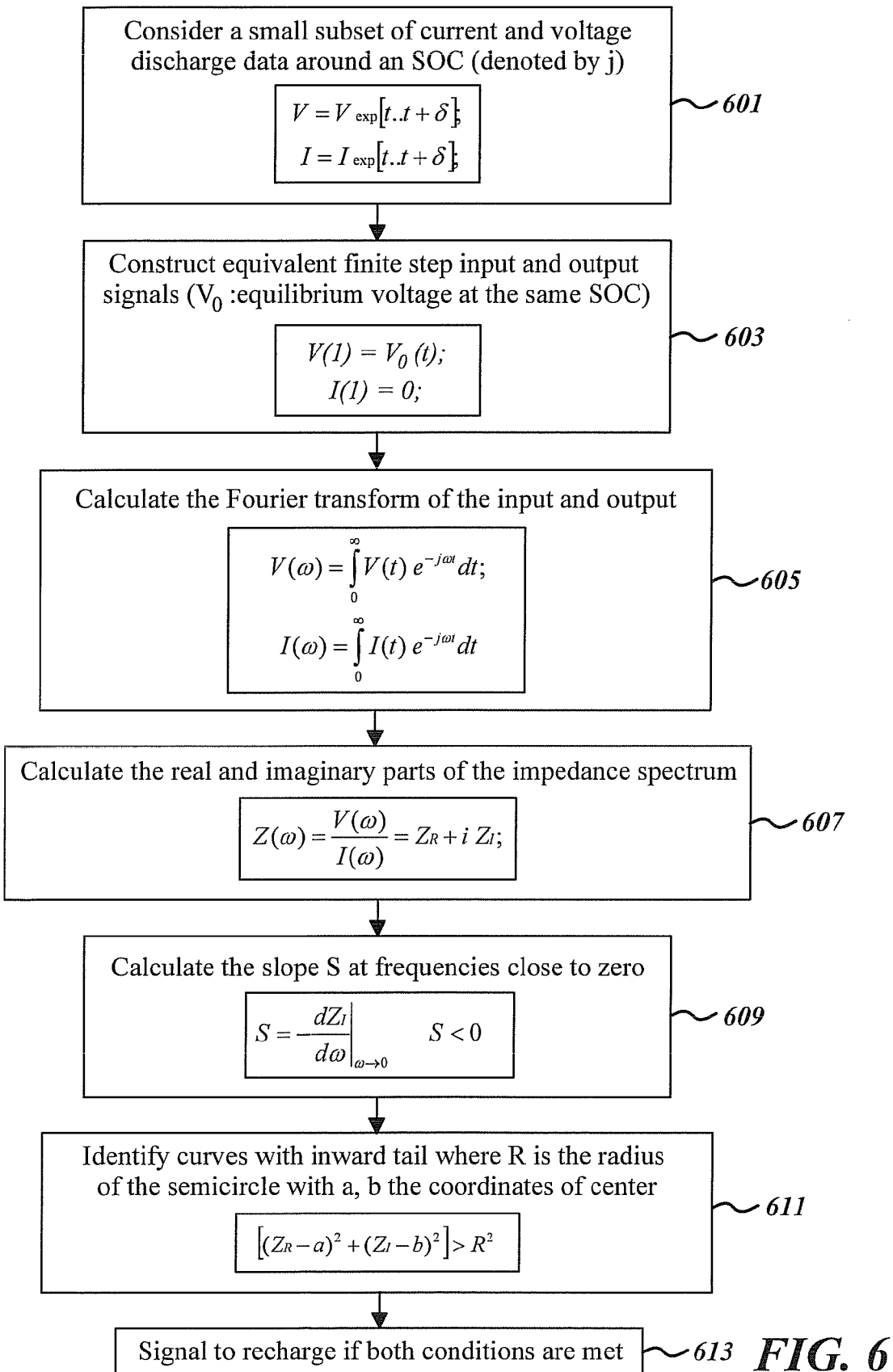
FIG. 6 shows an exemplary logic process flow and associated mathematical relationships for determining an impedance spectrum of a battery system and determining whether a recharge of the battery system is indicated according to exemplary embodiments.

Referring to FIG. 6 is shown a logic process flow diagram (e.g., software and/or hardware implemented) to determine an impedance spectrum and to analyze the impedance spectrum to determine whether a battery recharge is indicated and/or estimate a time to battery recharge.

In step 601, current and voltage discharge data may be collected around a selected state of charge of a battery system (associated mathematical relationships shown adjacent to logical process step)(e.g., $$\left(\text{e.g.,} \quad \begin{matrix} V = V_{exp}[t \ldots t+\delta]; \\ I = I_{exp}[t \ldots t+\delta]; \end{matrix}\right).$$

In step 603, finite step input and output signals may be created (e.g., I(1)=0;). In step 605, a Fourier transform of the voltage and current input and output may be calculated to determined voltage and current as a function of frequency (e.g., $$\left.\begin{matrix} V(\omega) = \int_0^\infty V(t)e^{-j\omega t}\,dt; \\ I(\omega) = \int_0^\infty I(t)e^{-j\omega t}\,dt \end{matrix}\right).$$

In step 607, real and imaginary parts of the impedance spectrum may be determined from the Fourier transform values in step 605 (e.g., $$Z(\omega) = \frac{V(\omega)}{I(\omega)} = Z_R + iZ_I;).$$

In step 609, the behavior of impedance at frequencies close to zero may be characterized e.g., determine if slope is negative (e.g., $$S = -\left.\frac{dZ_I}{d\omega}\right|_{\omega\to 0} \quad S < 0).$$

In step 611, the low frequency tail of the impedance spectrum presented as real vs. imaginary values may be inspected to characterize low frequency tail, e.g., if inward/outward of semicircle radius (e.g., $[(Z_R-a)^2+(Z_I-b)^2]>R^2$). In step 613, a signal may be output based on results in steps 609 and 611.

The above description of embodiments of the invention is merely exemplary in nature and, thus, variations thereof are not to be regarded as a departure from the spirit and scope of the invention.

What is claimed is:

1. A method for determining whether a recharge of a rechargeable battery system is indicated comprising:
   providing impedance data over a frequency range, said impedance data characterizing operation a rechargeable battery within a selected time window;
   analyzing said impedance data for predetermined behavior of said impedance data indicating an approaching state of discharge of said battery; and,
   determining from said predetermined behavior of said impedance data whether a recharge of said rechargeable battery indicated; and
   recharging said rechargeable battery if a recharge of said rechargeable battery is indicated by said impedance data.

2. The method of claim 1, wherein said impedance data is calculated from a Fourier transform of current and voltage data characterizing discharge behavior of said battery system.

3. The method of claim 1, wherein said step of analyzing comprises presenting said impedance data as imaginary impedance versus frequency data and characterizing a slope of said data near zero frequency.

4. The method of claim 3, wherein said characterizing comprises determining whether said slope is negative.

5. The method of claim 3, wherein said step of analyzing comprises presenting said impedance data as imaginary impedance versus real impedance plot over said frequency range and characterizing a low frequency portion of said plot.

6. The method of claim 5, wherein said characterizing comprises determining whether said low frequency portion extends outward of a radius of a semicircle comprising said plot.

7. The method of claim 1, wherein said step of analyzing comprises presenting said impedance data as imaginary impedance versus real impedance plot over said frequency range and characterizing a low frequency portion of said plot.

8. The method of claim 1, wherein said rechargeable battery comprises a lithium containing cathode on discharge.

9. The method of claim 1, wherein said rechargeable battery comprises a vehicle battery system.

10. The method of claim 1, wherein said steps of providing, analyzing, and determining are implemented by programmable instructions executed by one or more on board vehicle controllers.

11. The method of claim 1, further comprising determining an estimated time within which said recharge should take place.

12. A method for determining whether a recharge of a rechargeable battery system is indicated comprising:
   providing impedance data over a frequency range, said impedance data characterizing operation a rechargeable battery within a selected time window;
   analyzing said impedance data for predetermined behavior of said impedance data indicating an approaching state of discharge of said battery; and,
   determining from said predetermined behavior of said impedance data whether a recharge of said rechargeable battery is indicated including determining an estimated time within which said recharge should take place; and
   recharging said rechargeable battery at said estimated time if a recharge of said rechargeable battery is indicated by said impedance data.

13. The method of claim 12, wherein said impedance data is calculated from a Fourier transform of current and voltage data characterizing discharge behavior of said battery system.

14. The method of claim 12, wherein said step of analyzing comprises characterizing a slope of an imaginary portion of said impedance data versus frequency data near zero frequency.

15. The method of claim 14, wherein said characterizing comprises determining whether said slope is negative.

16. The method of claim 12, wherein said step of analyzing wherein said step of analyzing comprises presenting said impedance data as imaginary impedance versus real impedance plot over said frequency range and characterizing a low frequency portion of said plot.

17. The method of claim 12, wherein said rechargeable battery comprises a lithium containing cathode on discharge.

18. The method of claim 12, wherein said rechargeable battery comprises a vehicle battery system.

19. The method of claim 12, wherein said steps of providing, analyzing, and determining are implemented by programmable instructions executed by one or more on board vehicle controllers.

20. A vehicle system for determining whether a recharge of a rechargeable battery system is indicated comprising:
   an on-board controller in communication with a vehicle battery system, said controller programmed to determine impedance data over a frequency range, said impedance data characterizing operation a rechargeable battery within a selected time window;
   said controller further programmed to analyze said impedance data for predetermined behavior of said impedance data indicating an approaching state of discharge of said battery system;
   said controller further programmed to determine from said predetermined behavior of said impedance data whether a recharge of said rechargeable battery is indicated;
   wherein said controller is further programmed to output at least one of a signal and a numerical value in response to a determination that said recharge is indicated by said impedance data.

* * * * *